US010811989B2

(12) United States Patent
Suzuki et al.

(10) Patent No.: US 10,811,989 B2
(45) Date of Patent: Oct. 20, 2020

(54) INVERTER UNIT

(71) Applicant: AISIN AW CO., LTD., Anjo-shi, Aichi-ken (JP)

(72) Inventors: Tomoyuki Suzuki, Anjo (JP); Masaru Nitta, Takahama (JP)

(73) Assignee: AISIN AW CO., LTD., Anjo-shi, Aichi-ken (JP)

(*) Notice: Subject to any disclaimer, the term of this patent is extended or adjusted under 35 U.S.C. 154(b) by 0 days.

(21) Appl. No.: 16/481,334

(22) PCT Filed: Mar. 22, 2018

(86) PCT No.: PCT/JP2018/011439
§ 371 (c)(1),
(2) Date: Jul. 26, 2019

(87) PCT Pub. No.: WO2018/180897
PCT Pub. Date: Oct. 4, 2018

(65) Prior Publication Data
US 2019/0393800 A1   Dec. 26, 2019

(30) Foreign Application Priority Data

Mar. 30, 2017 (JP) ................................ 2017-068987
Sep. 13, 2017 (JP) ................................ 2017-175938

(51) Int. Cl.
*H05K 7/00* (2006.01)
*H02M 7/00* (2006.01)
(Continued)

(52) U.S. Cl.
CPC ............ *H02M 7/003* (2013.01); *H01G 4/224* (2013.01); *H01G 4/228* (2013.01);
(Continued)

(58) Field of Classification Search
None
See application file for complete search history.

(56) References Cited

U.S. PATENT DOCUMENTS 8,355,244 B2 *  1/2013  Kimura .................. H05K 7/209
                                                     361/676
8,848,370 B2 *  9/2014  Shin ......................... B60K 6/22
                                                     361/699

(Continued)

FOREIGN PATENT DOCUMENTS

JP       2002-34268 A      1/2002
JP       2004-266973 A     9/2004
                (Continued)

OTHER PUBLICATIONS

International Search Report for PCT/JP2018/011439 dated May 15, 2018 (PCT/ISA/210).

*Primary Examiner* — Courtney L Smith
(74) *Attorney, Agent, or Firm* — Sughrue Mion, PLLC

(57) ABSTRACT

An inverter unit with reduced wiring impedance that includes a switching element unit and a capacitor unit is implemented. A capacitor unit 4 includes first portions 41 with a first length L1 which is a length in a first direction D1 orthogonal to a reference plane R1 of an inverter unit; and second portions 42 with a second length L2 shorter than the first length L1, and the first portions 41 and the second portions 42 are disposed adjacent to each other along the reference plane R1. The switching element unit 3 is disposed so as to overlap the second portions 42 as viewed in the first direction D1, and overlap the first portions 41 as viewed in a second direction D2 which is a direction in which the first portions 41 and the second portions 42 are arranged along the reference plane R1.

20 Claims, 9 Drawing Sheets

(51) Int. Cl.
*H01G 4/224* (2006.01)
*H01G 4/228* (2006.01)
*H02M 7/5387* (2007.01)
*H05K 5/00* (2006.01)
*H05K 7/20* (2006.01)
H02P 27/06 (2006.01)

(52) U.S. Cl.
CPC ...... *H02M 7/53871* (2013.01); *H05K 5/0026* (2013.01); *H05K 7/2089* (2013.01); *H02P 27/06* (2013.01)

(56) References Cited

U.S. PATENT DOCUMENTS

| | | | | |
|---|---|---|---|---|
| 2004/0062006 A1* | 4/2004 | Pfeifer | ................. | H01L 23/473 361/699 |
| 2009/0290398 A1* | 11/2009 | Kanie | ................. | H05K 7/1432 363/132 |
| 2017/0158042 A1* | 6/2017 | Miyazawa | ............ | B60L 15/007 |

FOREIGN PATENT DOCUMENTS

| JP | 2013-176297 A | 9/2013 |
|---|---|---|
| JP | 2016-163497 A | 9/2016 |

\* cited by examiner

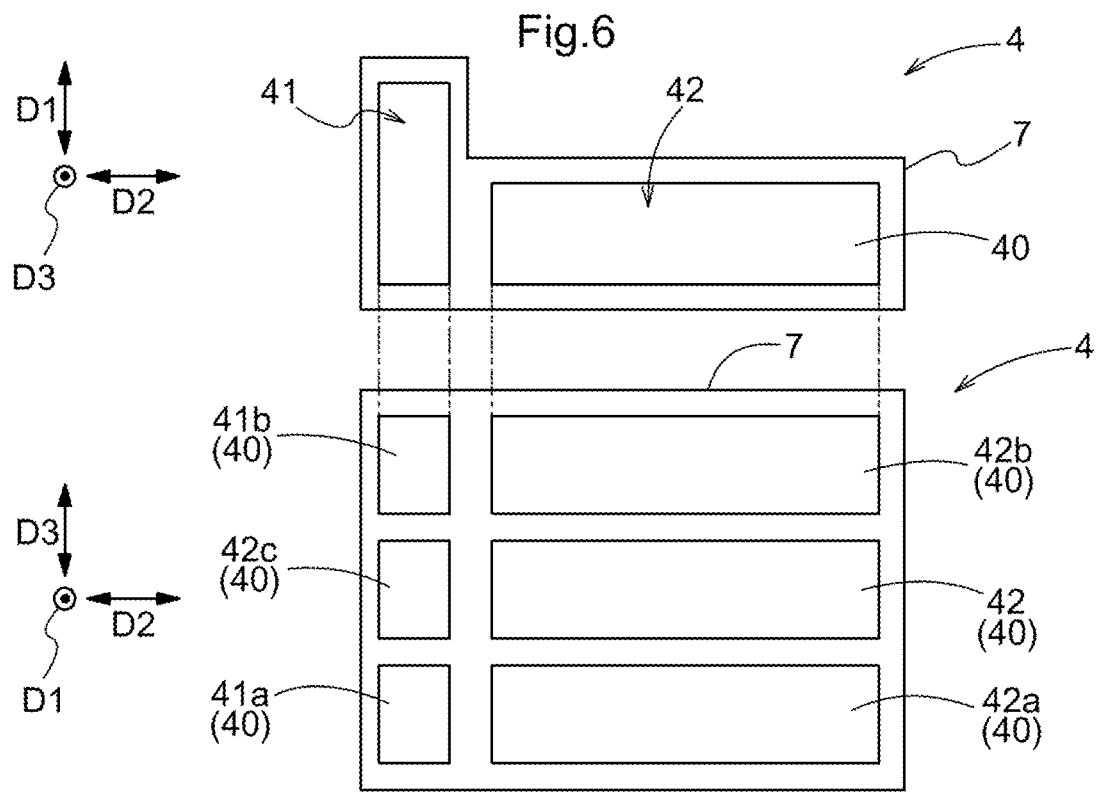
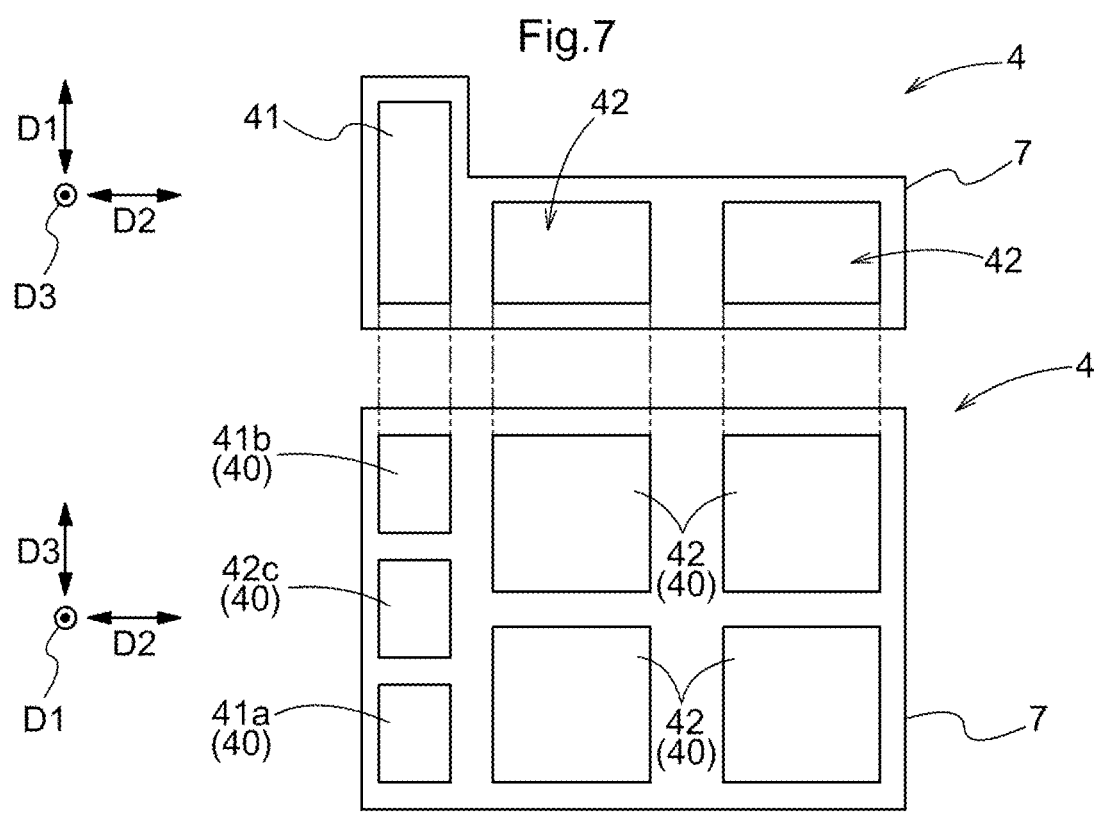

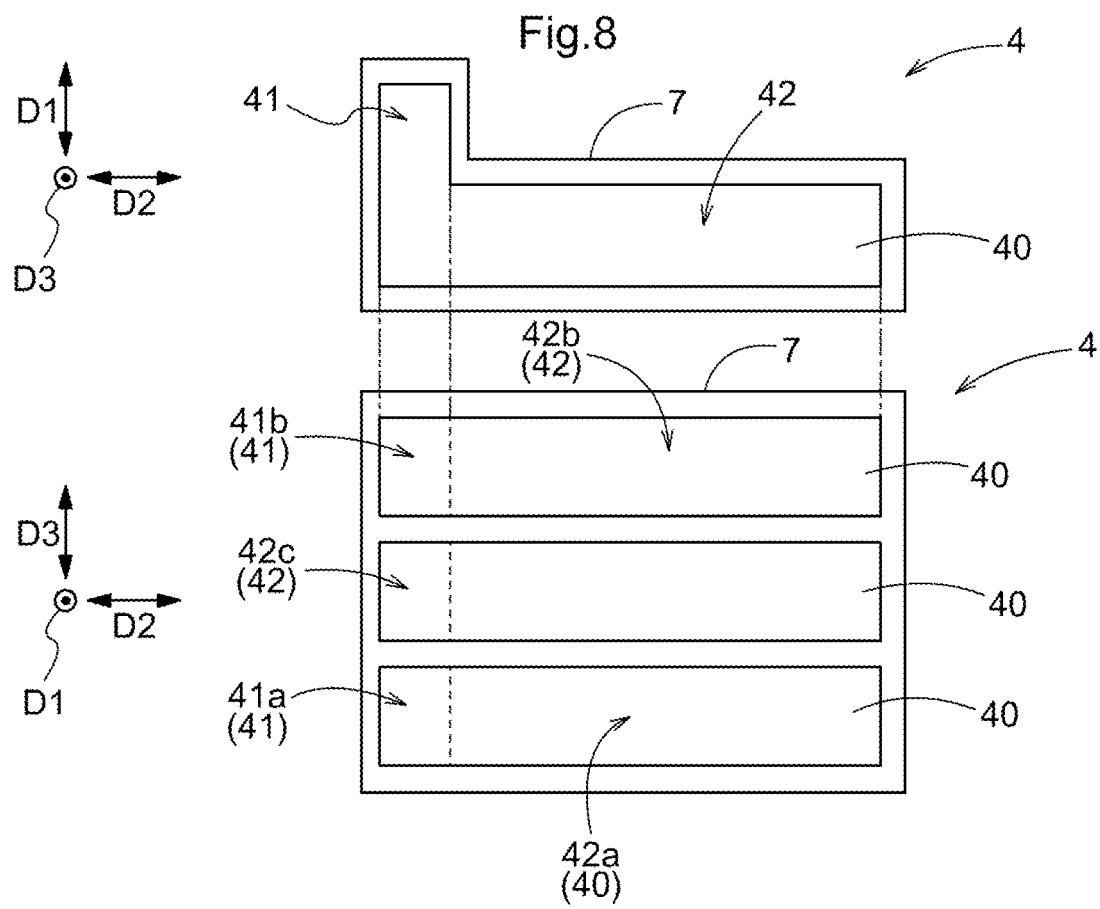

INVERTER UNIT

CROSS REFERENCE TO RELATED APPLICATIONS

This application is a National Stage of International Application No. PCT/JP2018/011439 filed Mar. 22, 2018, claiming priority based on Japanese Patent Application No. 2017-068987 filed Mar. 30, 2017 and Japanese Patent Application No. 2017-175938 filed Sep. 13, 2017.

TECHNICAL FIELD

Aspects of the present disclosure relate to an inverter unit including a switching element unit that forms an inverter circuit, and a capacitor unit that smooths a voltage on a direct-current side of the inverter circuit.

BACKGROUND ART

There is a case in which an inverter unit is formed by integrating a switching element unit that forms an inverter circuit with a capacitor unit that forms a smoothing capacitor on a direct-current side of the inverter circuit. Patent Literature 1 whose document number is shown below discloses an electric power conversion apparatus in which a capacitor module (300) is integrated with a power module (500) (FIGS. 33(A) to 33(C), etc. Note that in BACKGROUND ART the reference signs in parentheses are those in the literature referred to). In the electric power conversion apparatus, the flat-shaped power module (500) is disposed so as to be stacked on the rectangular parallelepiped-shaped capacitor module (300) with a watercourse body (220) for cooling sandwiched therebetween.

The area of the power module (500) is smaller than that of the capacitor module (300) as viewed from the top in a stacking direction. From the capacitor module (300), a plate conductor (301) extends in a direction of the power module (500) from a position where the capacitor module (300) and the power module (500) do not overlap each other as viewed in the stacking direction. The plate conductor (301) extends to a position where the plate conductor (301) overlaps the power module (500) as viewed in a direction orthogonal to the stacking direction, and is connected to the power module (301). The capacitor module (300) and the power module (500) are electrically connected to each other through the plate conductor (301) without the capacitor module (300) overlapping the power module (500) as viewed in the direction orthogonal to the stacking direction.

As described above, the area of the power module (500) is smaller than that of the capacitor module (300) as viewed from the top, but the plate conductor (301) for a connection with the capacitor module (300) is located on a side of the power module (500). Since the plate conductor (301) extends from the capacitor module (300) in the stacking direction, it cannot be really said that the impedance of the plate conductor (301), such as inductance and electrical resistance, is sufficiently reduced.

CITATIONS LIST

Patent Literature

Patent Literature 1: JP 2013-176297 A

SUMMARY OF DISCLOSURE

Technical Problems

In view of the above-described background, it is desired that the wiring impedance of an inverter unit including a switching element unit and a capacitor unit be reduced.

Solutions to Problems

As one aspect, an inverter unit in view of the above description is an inverter unit including: a switching element unit forming an inverter circuit that includes a plurality of switching elements and converts electric power between direct current and alternating current; and a capacitor unit that smooths a voltage on a direct-current side of the inverter circuit, and the capacitor unit includes a first portion with a first length, the first length being a length in a first direction, the first direction being a direction orthogonal to a reference plane of the inverter unit; and a second portion with a second length shorter than the first length, the second length being a length in the first direction, and the first portion and the second portion are disposed adjacent to each other along the reference plane, and the switching element unit is disposed so as to overlap the second portion as viewed in the first direction, and overlap the first portion as viewed in a second direction, the second direction being a direction in which the first portion and the second portion are arranged along the reference plane.

According to this configuration, the second portion of the capacitor unit and the switching element unit overlap each other as viewed in the first direction, and the switching element unit is disposed so as to be stacked on the capacitor unit in the first direction which is a so-called stacking direction. Furthermore, the first portion of the capacitor unit and the switching element unit overlap each other as viewed in the second direction, and lateral (a lateral direction (the second direction) orthogonal to the stacking direction (the first direction)) space of the switching element unit disposed on the capacitor unit is effectively used. That is, since the switching element unit can be disposed so as to be adjacent to the first portion of the capacitor unit in the second direction, the switching element unit and the capacitor unit can be electrically connected to each other at a short distance. By this, impedance, such as inductance and electrical resistance, occurring when the switching element unit and the capacitor unit are electrically connected to each other can be reduced. Namely, according to this configuration, the wiring impedance of the inverter unit including the switching element unit and the capacitor unit can be reduced.

Further features and advantages of the inverter unit will become apparent from the following description of an embodiment which will be described with reference to the drawings.

BRIEF DESCRIPTION OF DRAWINGS

FIG. 6 is a diagram schematically showing exemplary disposition of capacitor elements.

FIG. 7 is a diagram schematically showing exemplary disposition of capacitor elements.

FIG. 8 is a diagram schematically showing exemplary disposition of capacitor elements.

DESCRIPTION OF EMBODIMENTS

Figure 1:
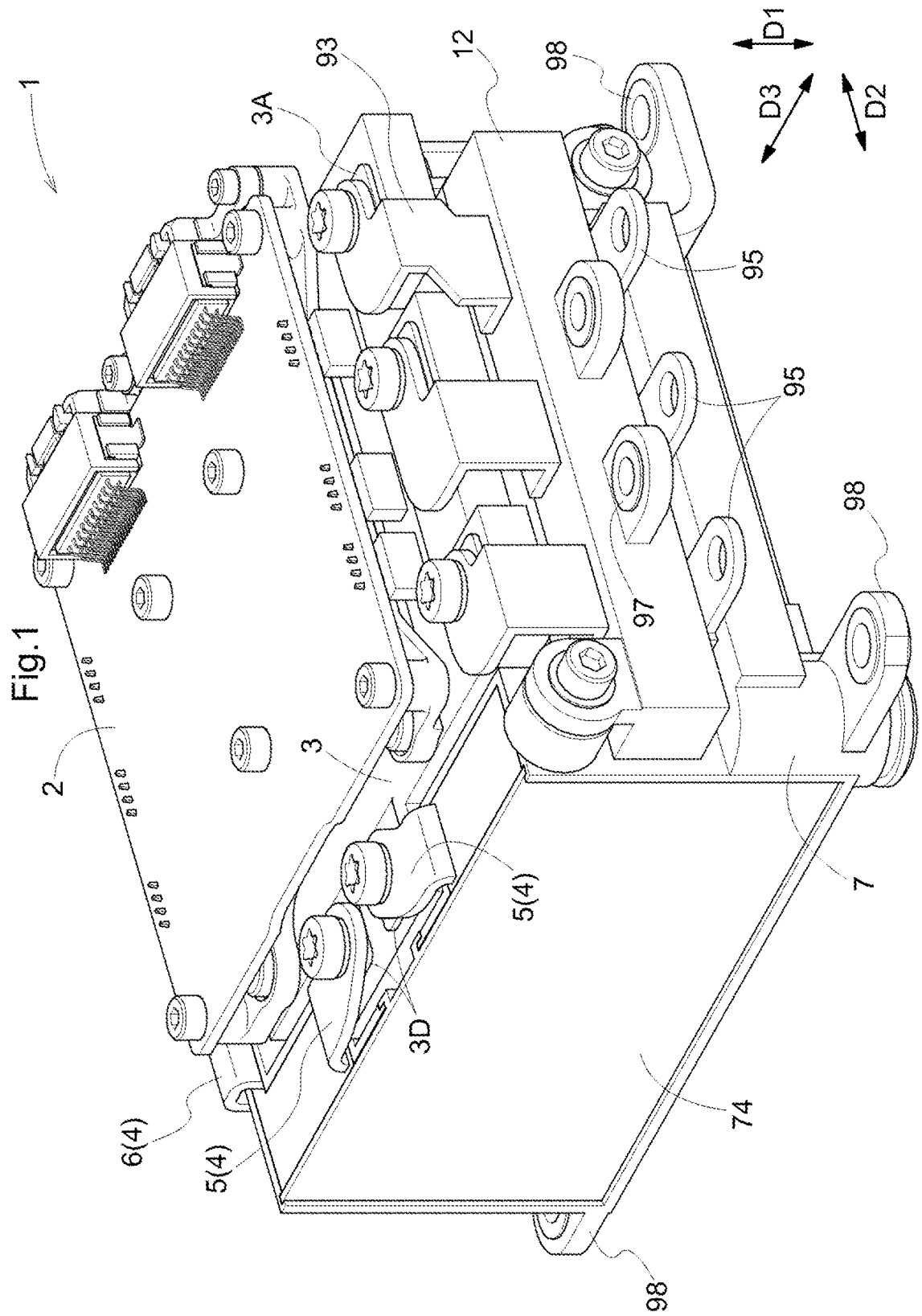
FIG. 1 is an external perspective view of an inverter unit.
Figure 2:
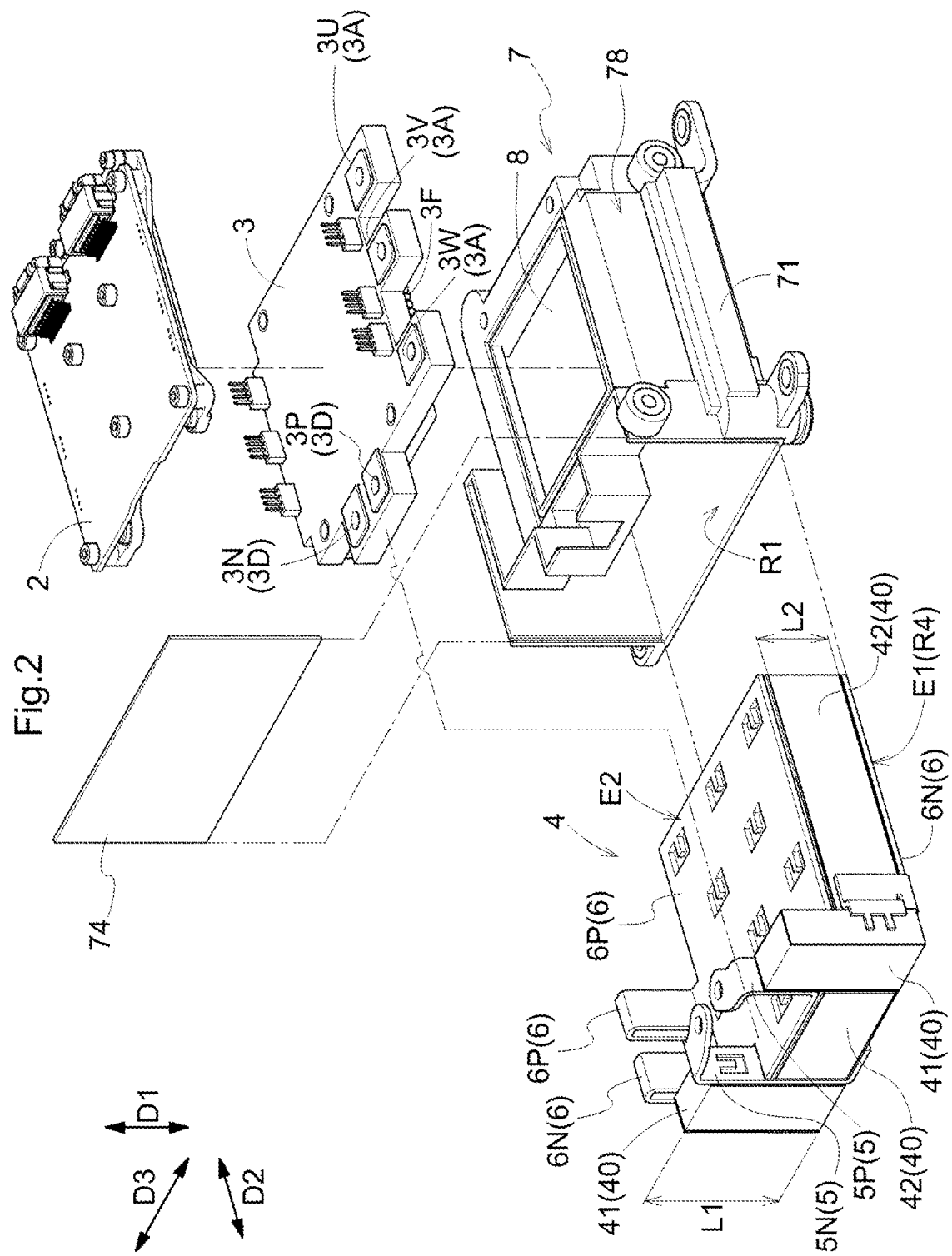
FIG. 2 is an exploded perspective view of the inverter unit.
Figure 3:
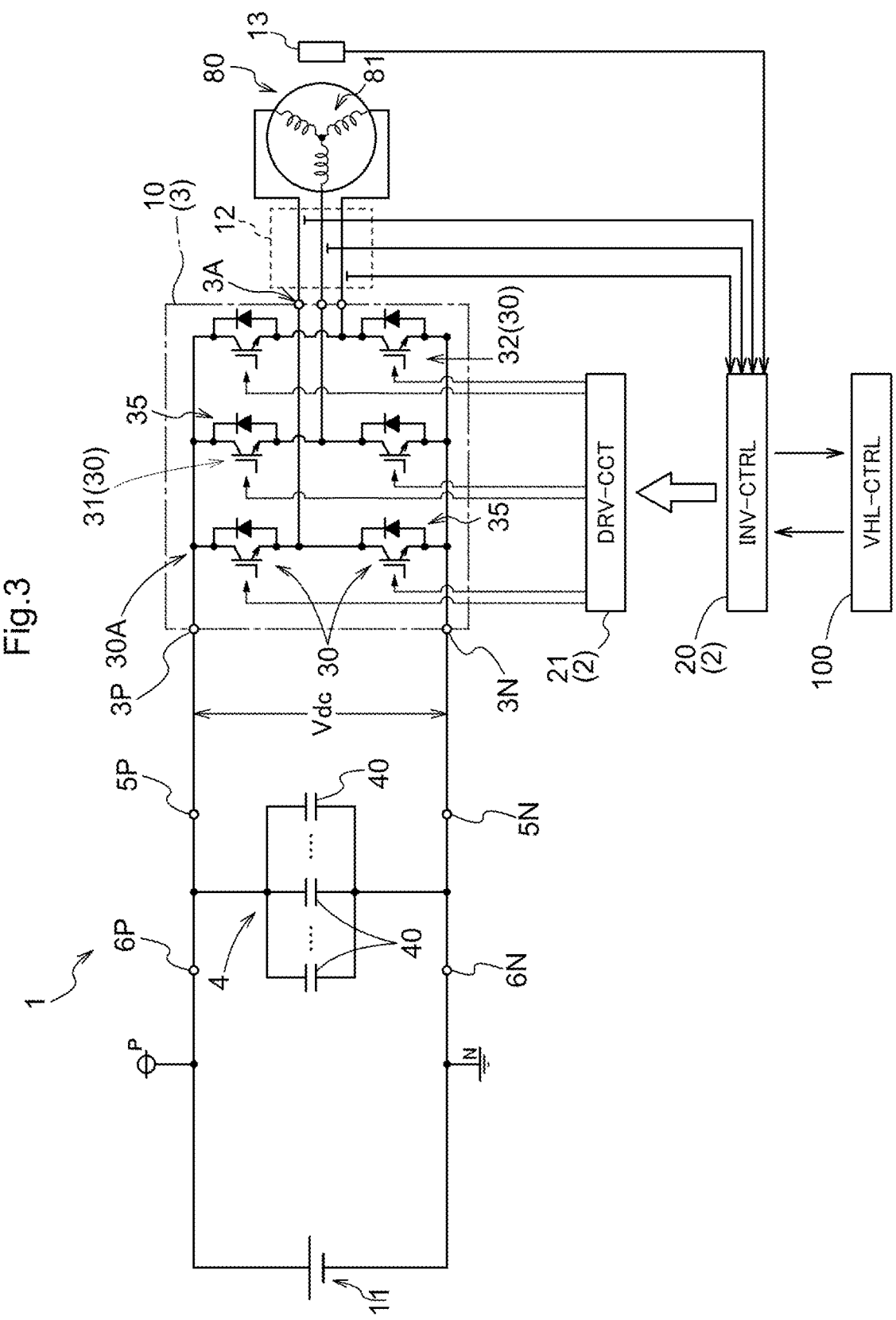
FIG. 3 is a schematic circuit block diagram of the inverter unit.

An embodiment of an inverter unit will be described below based on the drawings. FIG. 1 is an external perspective view of an inverter unit 1, FIG. 2 is an exploded perspective view of the inverter unit 1, and FIG. 3 is a schematic circuit block diagram of the inverter unit 1. As shown in FIGS. 1 and 2, the inverter unit 1 includes a control unit 2, a switching element unit 3, and a capacitor unit 4 accommodated in a capacitor case 7 which are stacked on top of each other in a first direction D1 (stacking direction). As shown in FIG. 3, the switching element unit 3 forms an inverter circuit 10 that is configured to include a plurality of switching elements 30 and that is connected to a rotating electrical machine 80 serving as a drive power source of a vehicle and a direct-current power supply 11 to convert electric power between direct current and alternating current. The control unit 2 is configured to include an inverter control apparatus 20 that generates a control signal for performing switching control of the plurality of switching elements 30 included in the inverter circuit 10; and a drive circuit 21 that adds drive power to the control signal and relays the control signal. The capacitor unit 4 is a smoothing capacitor (direct-current link capacitor) that smooths a direct-current link voltage Vdc which is a voltage on a direct-current side of the inverter circuit 10.

As shown in FIG. 2, the capacitor unit 4 has first portions 41 with a first length L1 which is a length in the first direction D1 which is a direction orthogonal to a reference plane R1 of the inverter unit 1; and second portions 42 with a second length L2 which is a length in the first direction D1. Note that the second length L2 is shorter than the first length L1. Note also that the first portions 41 and the second portions 42 are disposed adjacent to each other along the reference plane R1. As shown in FIGS. 1 and 2, the switching element unit 3 is disposed so as to overlap the second portions 42 as viewed in the first direction D1, and overlap the first portions 41 as viewed in a second direction D2 which is a direction in which the first portions 41 and the second portions 42 are arranged along the reference plane R1.

The capacitor unit 4 may be formed of a single capacitor element 40, but since, as described above, the capacitor unit 4 has two types of portions with different lengths in the first direction D1, the capacitor unit 4 may be formed of a plurality of capacitor elements 40. FIGS. 6 to 8 exemplify modes in which the capacitor unit 4 is formed of a plurality of capacitor elements 40. FIGS. 6 to 8 on the top show the disposition of capacitor elements 40 as viewed in a third direction D3 orthogonal to the first direction D1 and the second direction D2, and FIGS. 6 to 8 on the bottom show the disposition of capacitor elements 40 as viewed in the first direction.

FIG. 6 exemplifies a mode in which a capacitor unit 4 is formed of two first portions 41 and four second portions 42. The capacitor unit 4 whose detailed configuration is exemplified below with reference also to FIGS. 4, 5, etc., will be described as one that conforms to the mode shown in FIG. 6. Reference sign 41a and 41b correspond to first portions 41 having the same reference signs in FIGS. 2, 4, 5, etc. In addition, reference sign 42a, 42b, and 42c correspond to second portions 42 having the same reference signs in FIGS. 2, 4, 5, etc. FIG. 7 exemplifies a mode in which a capacitor unit 4 is formed of two first portions 41 and five second portions 42. FIG. 7 only exemplifies reference sign 41a and 41b corresponding to first portions 41 having the same reference signs in FIGS. 2, 4, 5, etc., and reference sign 42c corresponding to a second portion 42 having the same reference sign in FIGS. 2, 4, 5, etc. FIG. 8 exemplifies a mode in which a first portion 41 and a second portion 42 are formed in a single capacitor element 40, and furthermore, a capacitor unit 4 is formed of a plurality of capacitor elements 40. In this case, too, reference sign 41a and 41b correspond to first portions 41 having the same reference signs in FIGS. 2, 4, 5, etc., and reference sign 42a, 42b, and 42c correspond to second portions 42 having the same reference signs in FIGS. 2, 4, 5, etc.

When the capacitor unit 4 is thus formed of a plurality of capacitor elements 40, there are various variations. As long as the first portions 41 and the second portions 42 are disposed as shown below, it does not matter whether the capacitor unit 4 is formed of a single capacitor element 40 or a plurality of capacitor elements 40 as exemplified in FIGS. 6 to 8. Namely, as long as the capacitor unit 4 includes the first portions 41 with the first length L1 which is a length in the first direction D1; and the second portions with the second length L2 which is a length in the first direction D1, and the first portions 41 and the second portions 42 are disposed adjacent to each other along the reference plane R1, it does not matter whether the capacitor unit 4 is formed of a single element (40) or a plurality of elements (40).

Note that when the capacitor unit 4 is formed such that the capacitor elements 40 are accommodated in a case and a cover, even if the lengths in the first direction D1 of the capacitor elements 40 themselves which are accommodated inside the capacitor unit 4 are the same, the capacitor unit 4 can be formed such that the first length L1 is longer than the second length L2 in an external view of the capacitor unit 4. However, the capacitor unit 4 of the present embodiment does not include such a mode. Allowing the capacitor unit 4 that uses capacitor elements 40 with the same length in the first direction D1 to have different lengths in the first direction D1 on the exterior thereof requires some kind of wiring, etc., in the interior of the capacitor unit 4, and thus, there is a possibility of an increase in impedance such as electrical resistance and inductance. This may reduce the electrical characteristics of the inverter unit 1. Therefore, regardless of whether there is a single or a plurality of capacitor elements 40, the capacitor unit 4 adopts a mode in which the length in the first direction D1 of capacitor elements 40 at the first portions 41 in the capacitor unit 4 is longer than the length in the first direction D1 of capacitor elements 40 at the second portions 42.

Now, a circuit configuration of the inverter unit 1 will be described. As described above, the inverter unit 1 controls driving of the rotating electrical machine 80 through the inverter circuit 10. The rotating electrical machine 80 serving as a vehicle's drive power source is a rotating electrical machine that operates by alternating current of a plurality of phases (here, three-phase alternating current), and can function as both an electric motor and a generator. The inverter circuit 10 is connected to the direct-current power supply 11 and the rotating electrical machine 80 of alternating current to convert electric power between direct current and alternating current of a plurality of phases (here, three-phase alternating current). The direct-current power supply 11 is a high-voltage, high-capacity direct-current power supply, e.g., a secondary battery (battery) such as a nickel-hydrogen battery or a lithium-ion battery, or an electric double-layer capacitor, and has a rated power supply voltage of, for example, 200 to 400 [V]. The rotating electrical machine 80 converts electric power from the direct-current power supply 11 into mechanical power through the inverter circuit 10 (motoring). Alternatively, the rotating electrical machine 80 converts rotary drive power transmitted from an internal combustion engine or wheels which are not shown into electric power, and charges the direct-current power supply 11 through the inverter circuit 10 (regeneration).

The inverter circuit 10 is configured to include the plurality of switching elements 30. For the switching elements 30, it is preferred to apply power semiconductor devices that can operate at high frequencies, such as insulated gate bipolar transistors (IGBTs), power metal oxide semiconductor field effect transistors (MOSFETs), silicon carbide-metal oxide semiconductor FETs (SiC-MOSFETs), SiC-static induction transistors (SiC-SITs), and gallium nitride-MOSFETs (GaN-MOSFETs). FIG. 3 exemplifies a mode in which IGBTs are used as the switching elements 3.

As shown in FIG. 3, one arm 30A is formed by connecting two switching elements 30 in series between the direct-current positive polarity side (positive polarity P) and direct-current negative polarity side (negative polarity N) of the inverter circuit 10. In the case of three-phase alternating current, three (three phases) series circuits (three arms 30A) are connected in parallel. That is, a bridge circuit is formed in which one series circuit (arm) is provided for each of stator coils 81 for the U-, V-, and W-phases of the rotating electrical machine 80. In addition, each switching element 3 has a freewheeling diode 35 connected in parallel thereto, with a direction going from a lower-stage side to an upper-stage side being a forward direction. A midpoint of each series circuit (arm 30A) including a pair of switching elements 30 for a corresponding phase, i.e., a connecting point between a switching element 30 on a positive-polarity P side (upper-stage-side switching element 31) and a switching element 30 on a negative-polarity N side (lower-stage-side switching element 32), is connected to a corresponding one of the three-phase stator coils 81 of the rotating electrical machine 80.

The inverter circuit 10 including a plurality of such switching elements 30 is often formed as a unit called an intelligent power module (IPM) or an intelligent power device (IPD). The switching element unit 3 of the present embodiment is such an IPM or IPD. Although here a mode is exemplified in which the arms 30A for the three phases are formed as a single switching element unit 3, the switching element unit 3 may be formed of a plurality of IPMs or IPDs, each of which forms an arm 30A for a single phase.

The inverter circuit 10 is controlled by the inverter control apparatus (INV-CTRL) 20. The inverter control apparatus 20 is constructed using a logic circuit such as a microcomputer as a core member. For example, the inverter control apparatus 20 controls the rotating electrical machine 80 through the inverter circuit 10 by performing current feedback control using a vector control method, based on a target torque of the rotating electrical machine 80 which is provided as a request signal through a controller area network (CAN), etc., from another control apparatus such as a vehicle control apparatus (VHL-CTRL) 100 which is one of the highest-level control apparatuses of the vehicle.

Actual currents flowing through the stator coils 81 for the respective phases of the rotating electrical machine 80 are detected by a current sensor 12, and a magnetic pole position at each time point of a rotor of the rotating electrical machine 80 is detected by a rotation sensor 13 such as a resolver, and the inverter control apparatus 20 obtains results of the detection. The inverter control apparatus 20 performs current feedback control using the results of the detection by the current sensor 12 and the rotation sensor 13. The inverter control apparatus 20 is configured to include various functional parts for current feedback control, and each functional part is implemented by the cooperation of hardware such as a microcomputer and software (program). The current feedback control is publicly known and thus a detailed description thereof is omitted here.

A control terminal of each switching element 30 (e.g., a gate terminal of an IGBT) forming the inverter circuit 10 is connected to the inverter control apparatus 20 through the drive circuit (DRV-CCT) 21, and switching control of the switching elements 30 is individually performed. The operating voltage (a power supply voltage of a circuit) of the vehicle control apparatus 100 and the inverter control apparatus 20 that include a microcomputer, etc., as a core is, for example, 5 [V] or 3.3 [V], and greatly differs from that of a high-voltage system circuit for driving the rotating electrical machine 80. In many cases, the inverter control apparatus 20, etc., operate by being supplied with electric power from a low-voltage direct-current power supply (not shown) which is a power supply with a lower voltage (e.g., 12 to 24 [V]) than the direct-current power supply 11. Since the operating voltages thus greatly differ, the drive circuit 21 improves each of driving capabilities (capabilities to allow a circuit at a subsequent stage to operate, e.g., voltage amplitude and output current) of a switching control signal (e.g., a gate drive signal) for each switching element 30, and relays (amplifies) the switching control signal. The inverter control apparatus 20 and the drive circuit 21 are formed in the control unit 2.

As shown in FIG. 2, the capacitor unit 4 is inserted into a case main body 71 of the capacitor case 7 laterally in the second direction D2, the case main body 71 being open on a one-end side thereof in the second direction D2. A sliding cover 74 is installed at an opening portion of the case main body 71 through which the capacitor unit 4 has passed, by which the capacitor unit 4 is accommodated in the capacitor case 7. The capacitor case 7 accommodates all capacitor elements 40 of the capacitor unit 4 that includes at least one capacitor element 40. In the present embodiment, an underside of the case main body 71 serves as the reference plane R1 of the inverter unit 1. With the capacitor unit 4 accommodated in the capacitor case 7, an underside R4 of the capacitor unit 4 substantially matches the reference plane R1. Therefore, when the capacitor unit 4 is viewed alone, the underside R4 of the capacitor unit 4 equivalently serves as a reference plane.

The switching element unit 3 is installed above the capacitor case 7 having the capacitor unit 4 accommodated therein, and furthermore, the control unit 2 is installed above the switching element unit 3. That is, the capacitor unit 4, the switching element unit 3, and the control unit 2 are stacked on top of each other in turn in the first direction D1, forming the inverter unit 1.

The capacitor case 7 includes a coolant passage 8 through which a coolant circulates, between the switching element unit 3 and the second portions 42 in the first direction D1. Fins 3F for cooling are formed below the switching element unit 3 (on a capacitor case 7 side in the first direction D1). By a heat exchange between a coolant that flows through the coolant passage 8 and the fins 3F, the switching element unit 3 is cooled. In addition, the capacitor unit 4 is also a member that generates heat, though the amount of heat generated is smaller than that of the switching element unit 3. By providing the coolant passage 8 between the switching element unit 3 and the capacitor unit 4, both units can be cooled by a single cooling member. Therefore, the inverter unit 1 can be made compact.

The switching element unit 3 includes alternating-current terminals 3A (a U-phase terminal 3U, a V-phase terminal 3V, and a W-phase terminal 3W) for establishing a connection with alternating-current busbars 93 (see FIG. 1) for establishing a connection with the stator coils 81 of the rotating electrical machine 80; and direct-current terminals 3D (a positive-polarity terminal 3P and a negative-polarity terminal 3N) which are connected to the direct-current link voltage Vdc. As shown in FIGS. 1 and 2, the current sensor 12 is installed at a sensor installing portion 78 of the capacitor case 7. The alternating-current busbars 93 penetrates through the current sensor 12, and currents of the respective phases are detected, for example, in a contactless manner. A one-end side of each alternating-current busbar 93 is connected to a corresponding alternating-current terminal 3A of the switching element unit 3. Each alternating-current busbar 93 has an alternating-current connecting terminal 95 formed on another-end side thereof, and the alternating-current connecting terminal 95 is connected to a corresponding stator coil 81. Though details will be described later, the direct-current terminals 3D (the positive-polarity terminal 3P and the negative-polarity terminal 3N) are electrically connected to first busbars 5 (a first positive-polarity busbar 5P and a first negative-polarity busbar 5N) of the capacitor unit 4. Note that the inverter unit 1 is fixed to the vehicle, etc., by allowing fastening members to pass through fixing terminals 97 provided on an alternating-current terminal block 9 and fixing terminals 98 formed on the capacitor case 7.

As described above, the capacitor unit 4 includes the first portions 41 with the first length L1 which is a length in the first direction D1 and the second portions 42 with the second length L2 which is a length in the first direction D1, and the first portions 41 and the second portions 42 are disposed adjacent to each other along the reference plane R1. In addition, the switching element unit 3 is disposed so as to overlap the second portions 42 as viewed in the first direction D1, and overlap the first portions 41 as viewed in the second direction D2 which is a direction in which the first portions 41 and the second portions 42 are arranged along the reference plane R1. Namely, as is clear from FIGS. 1 and 2, the first portions 41 of the capacitor unit 4 and the switching element unit 3 overlap each other as viewed in the second direction D2, and lateral (second direction D2) space of the switching element unit 3 disposed on the capacitor unit 4 is effectively used.

That is, the switching element unit 3 is disposed so as to be adjacent to the first portions 41 of the capacitor unit 4 in the second direction D2, enabling to electrically connect the switching element unit 3 to the capacitor unit 4 at a short distance. Though details will be described later, as shown in FIG. 1, the first busbars 5 (the first positive-polarity busbar 5P and the first negative-polarity busbar 5N) of the capacitor unit 4 and the direct-current terminals 3D (the positive-polarity terminal 3P and the negative-polarity terminal 3N) of the switching element unit 3 are close to each other and electrically connected to each other at a short distance. Therefore, impedance, such as inductance and electrical resistance, occurring when the switching element unit 3 and the capacitor unit 4 are electrically connected to each other can be reduced.

The capacitor unit 4 of the present embodiment has a structure capable of reducing the impedance of the capacitor unit 4 itself and the impedance between the capacitor unit 4 and other parts such as the switching element unit 3. Since a reduction in the impedance of the capacitor unit 4 itself is described above, a structure for reducing the impedance between the capacitor unit 4 and other parts such as the switching element unit 3, specifically, terminal disposition, etc., will be described below.

Figure 4:
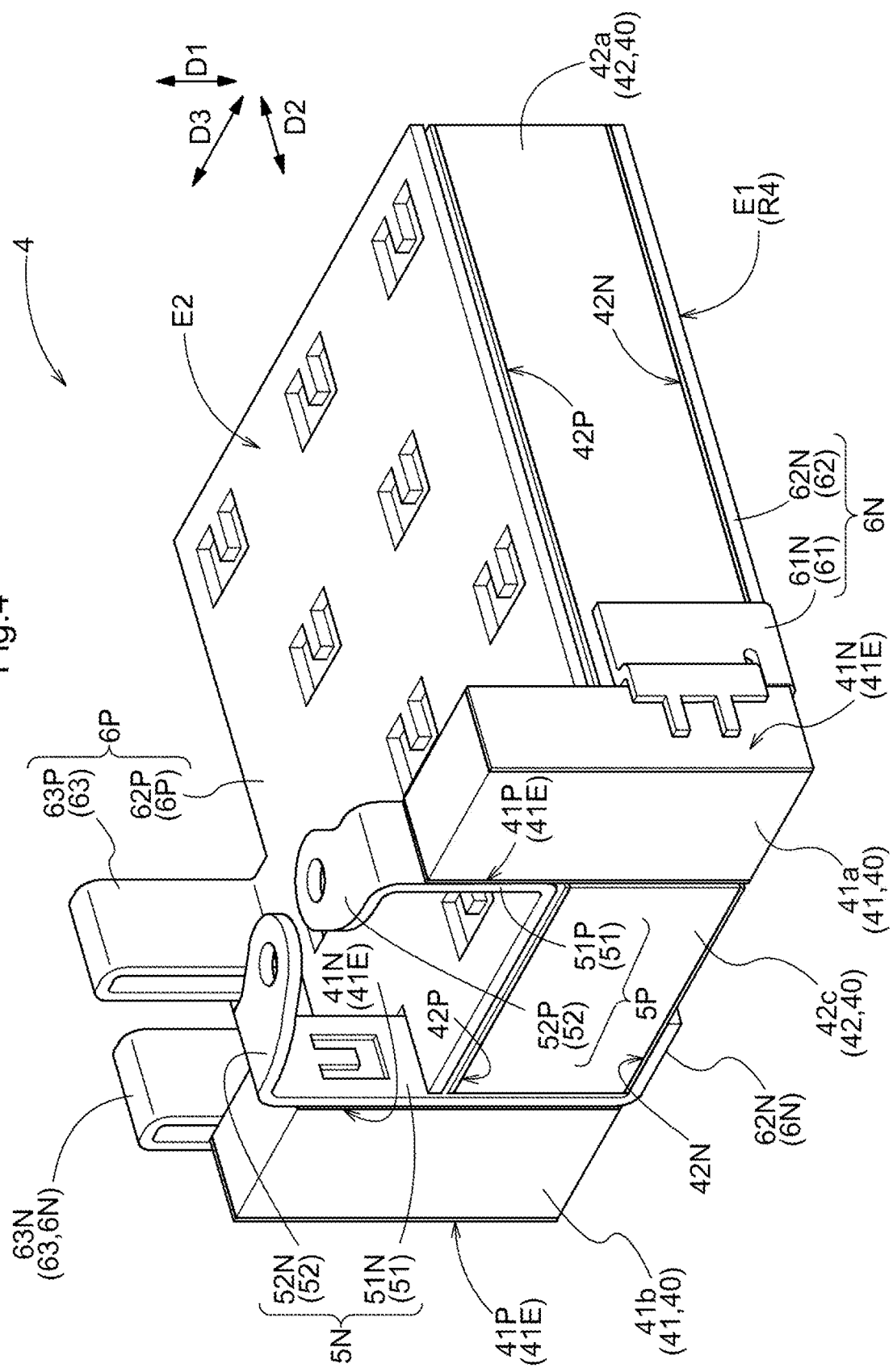
FIG. 4 is an external perspective view of a capacitor unit as viewed from above.
Figure 5:
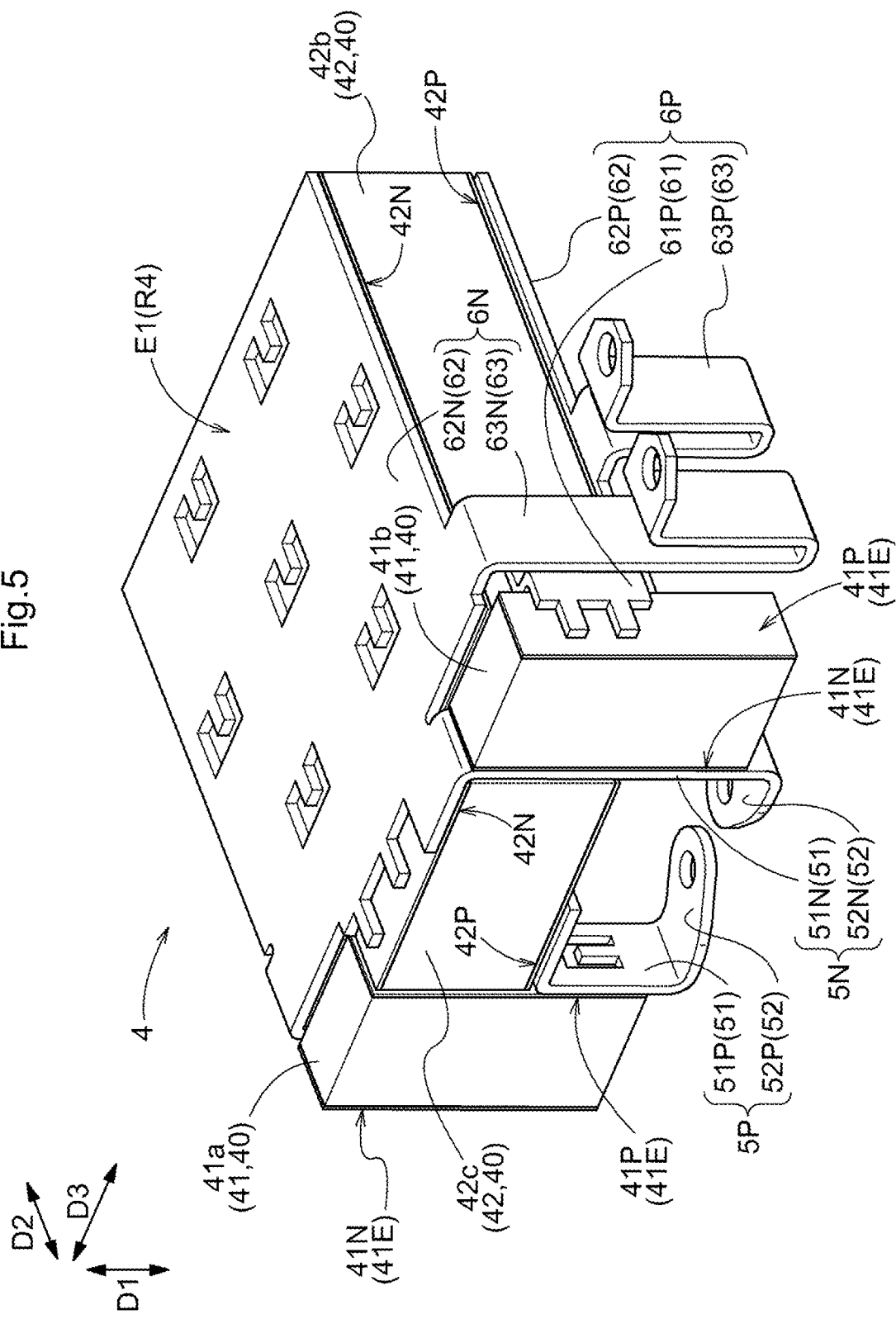
FIG. 5 is an external perspective view of the capacitor unit as viewed from below.

FIG. 4 is an external perspective view of the capacitor unit 4 as viewed from above, and FIG. 5 is an external perspective view of the capacitor unit 4 as viewed from below. In each first portion 41, a first positive electrode 41P and a first negative electrode 41N which are positive and negative electrodes of the capacitor unit 4 are formed as side electrodes 41E along sides in the first direction D1. In the second portions 42, as positive and negative electrodes of the capacitor unit 4, there are formed a second positive electrode 42P which is formed along either one of a first electrode plane E1 and a second electrode plane E2 and on one side in the first direction D1, and a second negative electrode 42N which is formed along the other one of the first electrode plane E1 and the second electrode plane E2 and on the other side. In the present embodiment, the second positive electrode 42P formed along the second electrode plane E2 is formed on one side in the first direction D1, and the second negative electrode 42N formed along the first electrode plane E1 is formed on the other side. Note that the first electrode plane E1 is a plane along the reference plane R1, and the second electrode plane E2 is a plane separated by the second length L2 from the first electrode plane E1 and parallel to the first electrode plane E1.

In addition, as described above with reference to FIG. 2, the switching element unit 3 includes the positive-polarity terminal 3P and the negative-polarity terminal 3N as the direct-current terminals 3D which are connected to the positive polarity P and negative polarity N on the direct-current side of the inverter circuit 10. In addition, the capacitor unit 4 includes the first busbars 5 that connect the direct-current terminals 3D (the positive-polarity terminal 3P and the negative-polarity terminal 3N) of the switching element unit 3 to the side electrodes 41E (the first positive electrode 41P and the first negative electrode 41N) of the first portions 41. The first busbars 5 include the first positive-polarity busbar 5P and the first negative-polarity busbar 5N, and the first positive-polarity busbar 5P electrically connects the first positive electrode 41P to the positive-polarity terminal 3P, and the first negative-polarity busbar 5N electrically connects the first negative electrode 41N to the negative-polarity terminal 3N.

As described above, the side electrodes 41E are electrodes placed along sides in the first direction D1 of the first portions 41. As shown in FIGS. 4 and 5, the first busbars 5 each include a first-direction extending portion 51 that extends in the first direction D1 with the first-direction extending portion 51 being in contact with a corresponding side electrode 41E. In addition, the first busbars 5 each include a connecting portion 52 that bends in the third direction D3 from an end portion of the first-direction extending portion 51. The two first portions 41 (41a and 41b) are divisionally disposed at two locations in the third direction D3 with spacing provided therebetween. The side electrodes 41E of the two divisionally-disposed first portions 41 (41a and 41b) are disposed on their corresponding first portions 41 (41a and 41b) so as to face each other as viewed in the third direction D3. The two first busbars 5 are in contact with their corresponding side electrodes 41E, and also face each other as viewed in the third direction D3. The connecting portions 52 that bend from the end portions of their corresponding first-direction extending portions 51 bend in directions in which the connecting portions 52 come close to each other.

The positive-polarity terminal 3P and the negative-polarity terminal 3N of the switching element unit 3 are disposed between the two divisionally-disposed first portions 41 (41a and 41b). The positive-polarity terminal 3P is fastened and electrically connected to a first positive-polarity connecting portion 52P that bends from the end portion of the first positive-polarity busbar 5P, using a fastening member. Likewise, the negative-polarity terminal 3N is fastened and electrically connected to a first negative-polarity connecting portion 52N that bends from the end portion of the first negative-polarity busbar 5N, using a fastening member.

By thus disposing the direct-current terminals 3D (the positive-polarity terminal 3P and the negative-polarity terminal 3N) of the switching element unit 3 between the two first portions 41 (41a and 41b), the distance between the capacitor unit 4 and the switching element unit 3 is reduced and the space use efficiency of the inverter unit 1 increases. In addition, since the side electrodes 41E are respectively formed on planes of one first portion 41 (41a, 41b) facing each other, the distances between the direct-current terminals 3D (3P and 3N) of the switching element unit 3 and the side electrodes 41E are also reduced. Therefore, the lengths of the first busbars 5 (5P and 5N) that electrically connect the direct-current terminals 3D (3P and 3N) of the switching element unit 3 to the side electrodes 41E can also be reduced, and thus, the impedance of the first busbars 5 (5P and 5N) can also be reduced.

As described above, in the second portions 42, as the positive and negative electrodes of the capacitor unit 4, the second positive electrode 42P formed along the second electrode plane E2 is formed on one side in the first direction D1, and the second negative electrode 42N formed along the first electrode plane E1 is formed on the other side. The capacitor unit 4 includes a second positive-polarity busbar 6P that is electrically connected to the second positive electrode 42P; and a second negative-polarity busbar 6N that is electrically connected to the second negative electrode 42N. The second positive-polarity busbar 6P includes a positive-polarity plate portion 62P (plate portion 62) which is formed in a flat shape along an electrode plane (the first electrode plane E1 or the second electrode plane E2; here, the second electrode plane E2) along which the second positive electrode 42P is placed. The second negative-polarity busbar 6N includes a negative-polarity plate portion 62N (plate portion 62) which is formed in a flat shape along an electrode plane (the first electrode plane E1 or the second electrode plane E2; here, the first electrode plane E1) along which the second negative electrode 42N is placed. Note that the second positive-polarity busbar 6P and the second negative-polarity busbar 6N are collectively referred to as second busbars 6.

The second positive electrode 42P and the second negative electrode 42N which are connected to the plate portions 62 of the second busbars 6 can be formed as relatively large electrodes without being obstructed by the capacitor unit 4 or the switching element unit 3, enabling to reduce impedance. In addition, the plate portions 62 of the second busbars 6 which are connected to the second positive electrode 42P and the second negative electrode 42N are also likewise formed as relatively large conductors in a direction along the reference plane R1, enabling to reduce impedance.

As shown in FIGS. 4 and 5, the first positive-polarity busbar 5P is continuously and integrally formed with the second positive-polarity busbar 6P. More specifically, the first positive-polarity busbar 5P is continuously and integrally formed with the positive-polarity plate portion 62P of the second positive-polarity busbar 6P. In addition, the first negative-polarity busbar 5N is continuously and integrally formed with the second negative-polarity busbar 6N. More specifically, the first negative-polarity busbar 5N is continuously and integrally formed with the negative-polarity plate portion 62N of the second negative-polarity busbar 6N.

The second busbars 6 further include first-portion connecting portions 61 that bend toward a capacitor element 40 side from the first electrode plane E1 and the second electrode plane E2 in the first direction D1. The first-portion connecting portions 61 are continuously and integrally formed with the plate portions 62 of the second busbars 6, respectively. Specifically, a positive-polarity first-portion connecting portion 61P bends from and is integrally formed with the positive-polarity plate portion 62P of the second positive-polarity busbar 6P. A negative-polarity first-portion connecting portion 61N bends from and is integrally formed with the negative-polarity plate portion 62N of the second negative-polarity busbar 6N. The side electrodes 41E formed on the first portions 41 are formed not only on planes of the two first portions 41 (41a and 41b) facing each other, but also on sides in the third direction D3 of both of the first portions 41 (41a and 41b). The positive-polarity first-portion connecting portion 61P and the negative-polarity first-portion connecting portion 61N are electrically connected to the side electrodes 41E, respectively, that are formed on planes of the two first portions 41 (41a and 41b) not facing each other.

Namely, both positive and negative electrodes formed as the side electrodes 41E at each first portion 41 are electrically connected to the first-direction extending portion 51 of a corresponding first busbar 5 or the first-portion connecting portion 61 of a corresponding second busbar 6. In addition, both positive and negative electrodes of the second portions 42 are electrically connected to the plate portions 62 of the second busbars 6. Furthermore, the first busbar 5 and the second busbar 6 are continuously and integrally formed with each other. Therefore, both positive and negative electrodes of all parts (the first portions 41 and the second portions 42 or all capacitor elements 40) forming the capacitor unit 4 are electrically connected to each other by the continuous busbars. Accordingly, the capacitor unit 4 can be appropriately connected to the direct-current side of the inverter circuit 10, for example, such that a potential difference caused by impedance does not occur between the first portions 41 and the second portions 42 of the capacitor unit 4. Namely, by reducing the impedance of the capacitor unit 4 itself, a direct-current link capacitor with excellent electrical characteristics is formed.

In addition, the connecting portions 52 of the first busbars 5 are short and are electrically connected to the switching element unit 3 in a position close to the capacitor unit 4. Therefore, the impedance at a point where the direct-current link capacitor is connected to the inverter circuit 10 is also reduced. Note that as shown in FIGS. 4 and 5, direct-current power supply connecting portions 63 (a positive-polarity direct-current power supply connecting portion 63P and a negative-polarity direct-current power supply connecting portion 63N) are further integrally formed with the plate portions 62 of the second busbars 6. Therefore, the impedance at a point where the direct-current link capacitor is connected to the direct-current power supply 11 is also reduced.

Figure 9:
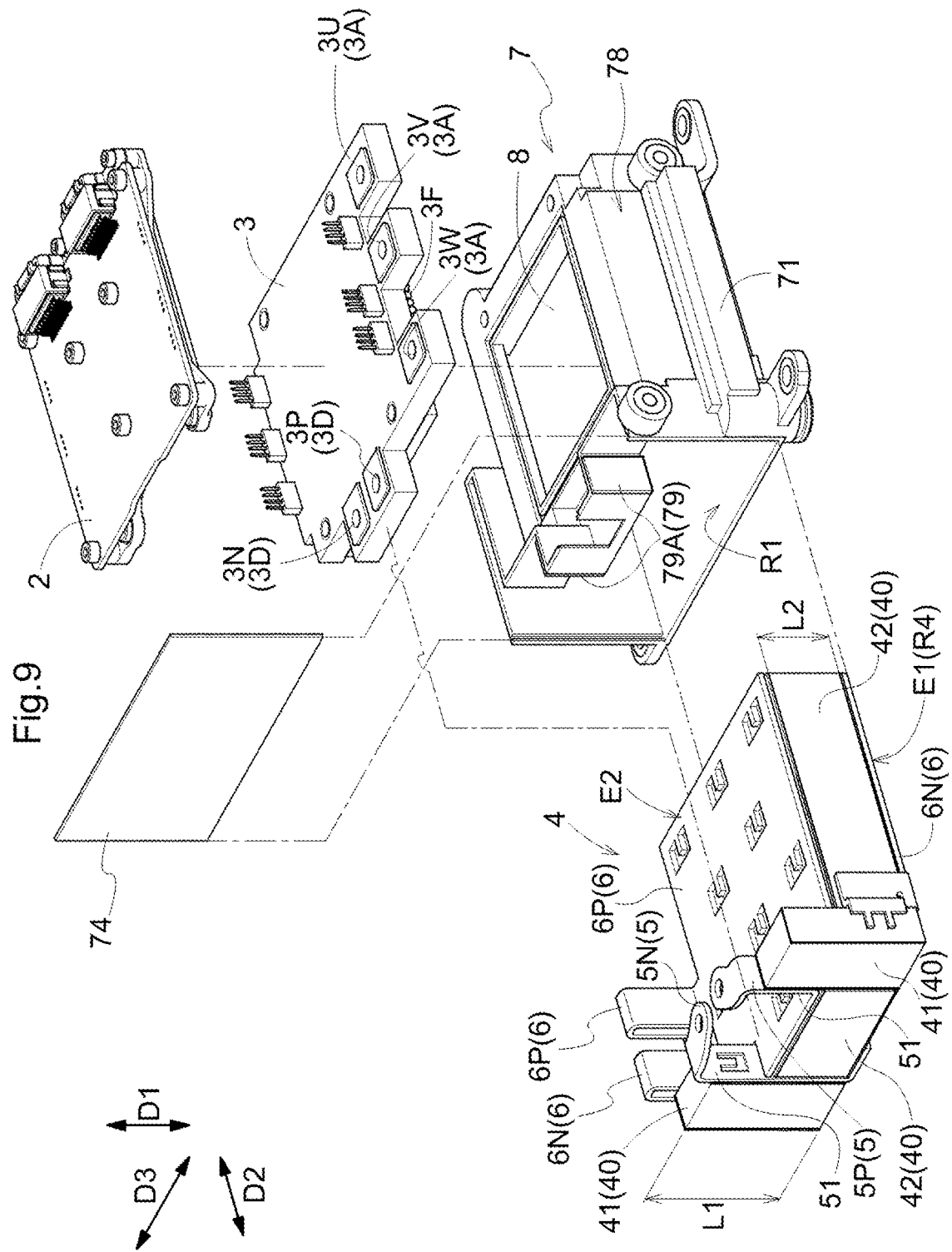
FIG. 9 is an exploded perspective view of the inverter unit.
Figure 10:
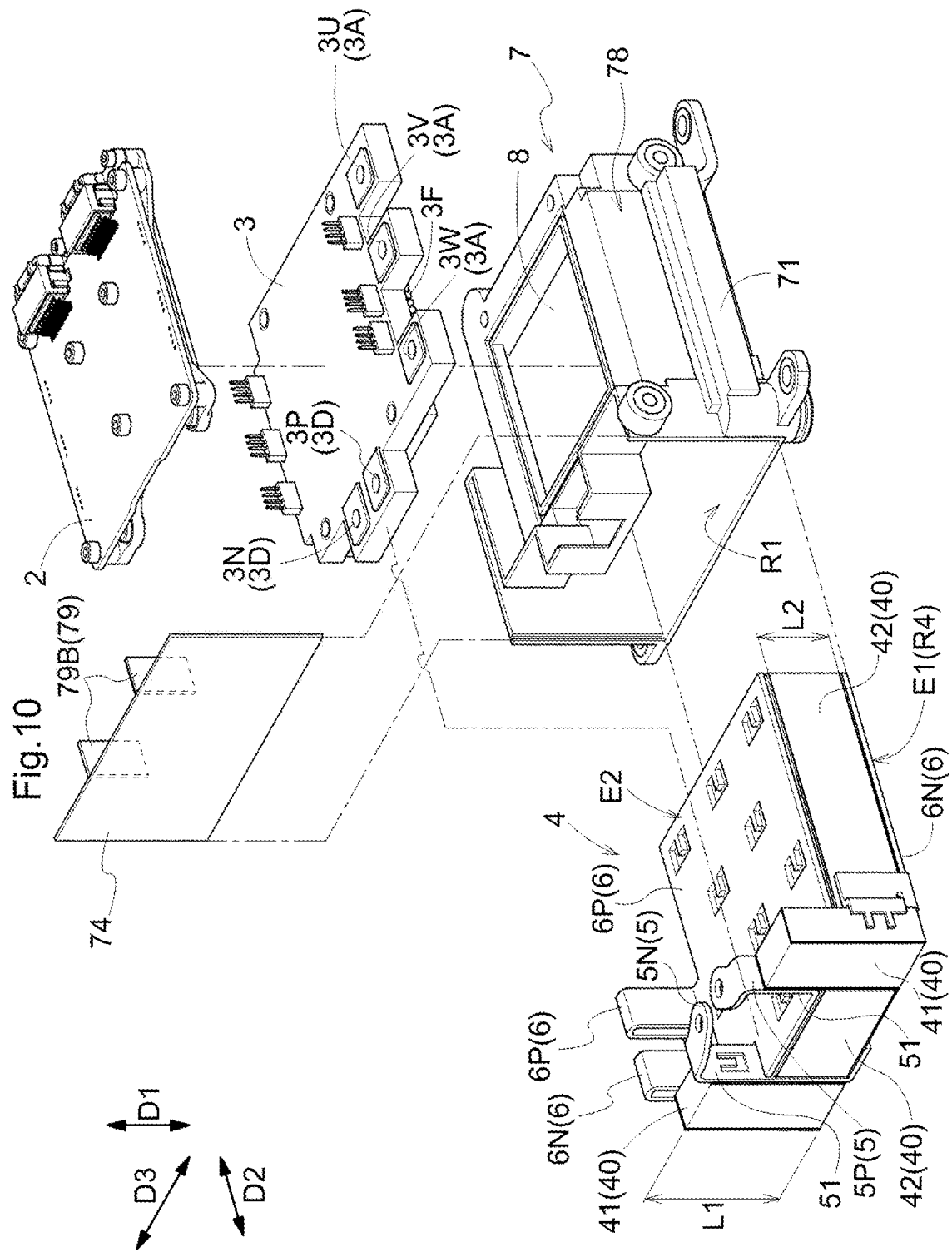
FIG. 10 is an exploded perspective view of the inverter unit.

Meanwhile, a large current flows through the first positive-polarity busbar 5P and the first negative-polarity busbar 5N. By a magnetic field generated by the current, inductance increases. To reduce the inductance, it is preferred that as shown in FIGS. 9 and 10, plate-like projecting portions 79 placed along the first-direction extending portions 51 of the respective first positive-polarity busbar 5P and first negative-polarity busbar 5N be provided on the capacitor case 7. FIG. 9 exemplifies a mode in which plate-like projecting portions 79A are provided on the case main body 71. In addition, FIG. 10 exemplifies a mode in which plate-like protruding portions 79B are provided on the sliding cover 74 which is installed on the case main body 71. Note that although here the sliding cover 74 is exemplified, a mode may be adopted in which a cover is installed on the case main body 71 by fastening members such as screws.

By a magnetic field generated by a current flowing through the first busbars 5 (the first positive-polarity busbar 5P and the first negative-polarity busbar 5N), an eddy current is generated in the plate-like projecting portions 79. A magnetic field generated by the eddy current is opposite in direction to the magnetic field generated by the current flowing through the first busbars 5. Namely, the magnetic field generated by the eddy current is in a direction in which the magnetic field generated by the current flowing through the first busbars 5 is canceled out, and by mutual inductance effect, the inductance of the first busbars 5 is reduced.

As described above, the compact inverter unit 1 with reduced wiring impedance that includes the switching element unit 3 and the capacitor unit 4 can be implemented.

SUMMARY OF THE EMBODIMENT

A summary of an inverter unit (1) described above will be briefly described below.

As one aspect, in an inverter unit (1) including a switching element unit (3) forming an inverter circuit (10) that includes a plurality of switching elements (30) and converts electric power between direct current and alternating current; and a capacitor unit (4) that smooths a voltage (Vdc) on a direct-current side of the inverter circuit (10), the capacitor unit (4) includes first portions (41) with a first length (L1) which is a length in a first direction (D1) which is a direction orthogonal to a reference plane (R1) of the inverter unit (1); and second portions (42) with a second length (L2) shorter than the first length (L1), the second length (L2) being a length in the first direction (D1), and the first portions (41) and the second portions (42) are disposed adjacent to each other along the reference plane (R1), and the switching element unit (3) is disposed so as to overlap the second portions (42) as viewed in the first direction (D1), and overlap the first portions (41) as viewed in a second direction (D2) which is a direction in which the first portions (41) and the second portions (42) are arranged along the reference plane (R1).

According to this configuration, the second portions (42) of the capacitor unit (4) and the switching element unit (3) overlap each other as viewed in the first direction (D1), and the switching element unit (3) is disposed so as to be stacked on the capacitor unit (4) in the first direction (D1) which is a so-called stacking direction. Furthermore, the first portions (41) of the capacitor unit (4) and the switching element unit (3) overlap each other as viewed in the second direction (D2), and lateral (a lateral direction (the second direction (D2)) orthogonal to the stacking direction (the first direction (D1))) space of the switching element unit (3) disposed on the capacitor unit (4) is effectively used. That is, the switching element unit (3) can be disposed so as to be adjacent to the first portions (41) of the capacitor unit (4) in the second direction (D2). In addition, by this, the switching element unit (3) and the capacitor unit (4) can be electrically connected to each other at a short distance. Therefore, impedance, such as inductance and electrical resistance, occurring when the switching element unit (3) and the capacitor unit (4) are electrically connected to each other can be reduced. Namely, according to this configuration, the wiring impedance of the inverter unit (1) including the switching element unit (3) and the capacitor unit (4) can be reduced.

Here, it is preferred that the capacitor unit (4) include a plurality of capacitor elements (40) inside the capacitor unit (4), and a length in the first direction (D1) of corresponding ones of the capacitor elements (40) at the first portions (41) be longer than a length in the first direction (D1) of corresponding ones of the capacitor elements (40) at the second portions (42).

When the capacitor unit (4) is formed such that the capacitor elements (40) are accommodated in a case and a cover, even if the lengths in the first direction (D1) of the capacitor elements (40) themselves which are accommodated inside the capacitor unit (4) are the same, the capacitor unit (4) can be formed such that the first length (L1) is longer than the second length (L2) in an external view of the capacitor unit (4). In this case, for example, inside the capacitor unit (4) there is a need to connect the capacitor elements (40) to each other by busbars, etc., or to provide wasted space, resulting in a limited reduction in impedance. Hence, it is desirable that the capacitor elements (40) be densely present inside the capacitor unit (4). Namely, impedance is appropriately reduced when the length in the first direction (D1) of the first portions (41) of the capacitor elements (40) present inside the capacitor unit (4) is longer than the length in the first direction (D1) of the second portions (42).

In addition, it is preferred that the first portions (41) each include a first positive electrode (41P) and a first negative electrode (41N) which are positive and negative electrodes of the capacitor unit (4), respectively, such that the first positive electrode (41P) and the first negative electrode (41N) each have a side electrode (41E) along a side in the first direction (D1); the switching element unit (3) include a positive-polarity terminal (3P) and a negative-polarity terminal (3N) that are connected to a positive polarity (P) and a negative polarity (N) on the direct-current side of the inverter circuit (10); and a first positive-polarity busbar (5P) that electrically connects the first positive electrode (41P) to the positive-polarity terminal (3P) and a first negative-polarity busbar (5N) that electrically connects the first negative electrode (41N) to the negative-polarity terminal (3N) each include a first-direction extending portion (51) extending in the first direction (D1) with the first-direction extending portion (51) being in contact with a corresponding one of the side electrodes (41E).

As described above, the first portions (41) overlap the switching element module (3) as viewed in the second direction (D2). Therefore, the side electrodes (41E) of the first portions (41) each can also be provided in a position in which the side electrode (41E) overlaps the switching element module (3) as viewed in the second direction (D2). The busbars (the first positive-polarity busbar (5P) and the first negative-polarity busbar (5N)) that connect the side electrodes (41E) to the direct-current terminals (the positive-polarity terminal (3P) and the negative-polarity terminal (3N)) of the switching element unit (3) are provided with the busbars being in contact with the side electrodes (41E). Namely, the busbars (5P and 5N) are provided in positions in which the busbars (5P and 5N) overlap the switching element module (3) as viewed in the second direction (D2), and can be located near both of the side electrodes (41E) and the direct-current terminals (3P and 3N) of the switching element unit (3). Therefore, the impedance of the busbars (5P and 5N) can be further reduced.

In addition, when the first portions (41) each include a first positive electrode (41P) and a first negative electrode (41N) which are side electrodes (41E), the switching element unit (3) includes the positive-polarity terminal (3P) and the negative-polarity terminal (3N), and the first positive-polarity busbar (5P) and the first negative-polarity busbar (5N) each include the first-direction extending portion (51), it is further preferred that the two first portions (41 (41a and 41b)) be divisionally disposed at two locations in a third direction (D3) orthogonal to the first direction (D1) and the second direction (D2), with spacing provided therebetween; the positive-polarity terminal (3P) and the negative-polarity terminal (3N) of the switching element unit (3) be disposed between the two divisionally-disposed first portions (41 (41a and 41b)); the first positive electrode (41P) be formed on one (41a (or 41b)) of the two first portions (41 (41a and 41b)) and the first negative electrode (41N) be formed on the other (41b (or 41a)) such that the side electrodes (41E) of the two divisionally-disposed first portions (41 (41a and 41b)) face each other as viewed in the third direction (D3); and the first positive-polarity busbar (5P) and the first negative-polarity busbar (5N) be disposed so as to be along the first positive electrode (41P) and the first negative electrode (41N), respectively, and to face each other as viewed in the third direction (D3).

By disposing the direct-current terminals (3D (the positive-polarity terminal (3P) and the negative-polarity terminal (3N))) of the switching element unit (3) between the two first portions (41 (41a and 41b)), the distance between the capacitor unit (4) and the switching element unit (3) is reduced and the space use efficiency of the inverter unit (1) increases. In addition, since the side electrodes (41E) are respectively formed on planes of the two first portions (41 (41a and 41b)) facing each other, the distances between the direct-current terminals (3D (3P and 3N)) of the switching element unit (3) and the side electrodes (41E) are also reduced. Therefore, the lengths of the busbars (the first positive-polarity busbar (5P) and the first negative-polarity busbar (5N)) that electrically connect the direct-current terminals (3P and 3N) of the switching element unit (3) to the side electrodes (41E) can also be reduced. As a result, the impedance of the busbars (5P and 5N) can also be reduced.

When the first portions (41) each include a first positive electrode (41P) and a first negative electrode (41N) which are side electrodes (41E), the switching element unit (3) includes the positive-polarity terminal (3P) and the negative-polarity terminal (3N), and the first positive-polarity busbar (5P) and the first negative-polarity busbar (5N) each include the first-direction extending portion (51), it is further preferred that a plane along the reference plane (R1) be a first electrode plane (E1) and a plane separated by the second length (L2) from the first electrode plane (E1) and parallel to the first electrode plane (E1) be a second electrode plane (E2); the second portions (42) include, as positive and negative electrodes of the capacitor unit (4), a second positive electrode (42P) formed along either one (E1 (or E2)) of the first electrode plane (E1) and the second electrode plane (E2) and on one side in the first direction (D1), and a second negative electrode (42N) formed along the other one (E1 (or E2)) of the first electrode plane (E1) and the second electrode plane (E2) and on the other side; the inverter unit (1) include a second positive-polarity busbar (6P) placed along either one (E1 (or E2)) of the first electrode plane (E1) and the second electrode plane (E2) and electrically connected to the second positive electrode (42P), and a second negative-polarity busbar (6N) placed along the other one (E2 (or E1)) of the first electrode plane (E1) and the second electrode plane (E2) and electrically connected to the second negative electrode (42N); and the first positive-polarity busbar (5P) be continuously formed with the second positive-polarity busbar (6P), and the first negative-polarity busbar (5N) be continuously formed with the second negative-polarity busbar (6N).

As described above, the capacitor unit (4) includes the first portions (41) and the second portions (42). The first positive-polarity busbar (5P) and the first negative-polarity busbar (5N) are connected to the side electrodes (41E) of the first portions (41). By connecting the second positive-polarity busbar (6P) and the second negative-polarity busbar (6N) to the second positive electrode (42P) and the second negative electrode (42N) which are formed along the two electrode planes (the first electrode plane (E1) and the second electrode plane (E2)) of the second portions (42), the second portions (42) can also be appropriately connected to the direct-current side of the inverter circuit (10). The two electrode planes (E1 and E2) of the second portions (42) are formed in the second direction (D2) and the third direction (D3) (i.e., along the reference plane (R1)) which are orthogonal to the first direction (D1) in which the capacitor unit (4) and the switching element unit (3) are stacked on top of each other. Therefore, the second positive electrode (42P) and the second negative electrode (42N) can be formed as relatively large electrodes without being obstructed by the capacitor unit (4) or the switching element unit (3), enabling to reduce impedance. In addition, the second positive-polarity busbar (6P) and the second negative-polarity busbar (6N) which are connected to those electrodes (42P and 42N) can also be likewise formed as relatively large conductors in a direction along the reference plane (R1), enabling to reduce the impedance thereof. Furthermore, since the first positive-polarity busbar (5P) is continuously formed with the second positive-polarity busbar (6P) and the first negative-polarity busbar (5N) is continuously formed with the second negative-polarity busbar (6N), the occurrence of a potential difference between the first portions (41) and the second portions (42) of the capacitor unit (4) which is caused by impedance is reduced, enabling to appropriately connect the capacitor unit (4) to the direct-current side of the inverter circuit (10).

In addition, it is preferred that the inverter unit (1) include a capacitor case (7) that accommodates the capacitor unit, and the capacitor case (7) include plate-like projecting portions (79) placed along the first-direction extending portions (51) of the respective first positive-polarity busbar (5P) and first negative-polarity busbar (5N).

A large current flows through the first positive-polarity busbar (5P) and the first negative-polarity busbar (5N), and by a magnetic field generated by the current, inductance increases. By providing the plate-like projecting portions (79), the inductance is reduced. Specifically, by a magnetic field generated by a current flowing through the first busbars (5) (the first positive-polarity busbar (5P) and the first negative-polarity busbar (5N)), an eddy current is generated in the plate-like projecting portions (79). A magnetic field generated by the eddy current is opposite in direction to the magnetic field generated by the current flowing through the first busbars (5). Namely, the magnetic field generated by the eddy current is in a direction in which the magnetic field generated by the current flowing through the first busbars (5) is canceled out, and by mutual inductance effect, the inductance of the first busbars (5) is reduced.

In addition, it is preferred that the inverter unit (1) include a capacitor case (7) that accommodates the capacitor unit (4), and the capacitor case (7) include a coolant passage (8) through which a coolant circulates, between the switching element unit (3) and the second portions (42) in the first direction (D1).

The switching element unit (3) and the capacitor unit (4) both are units that generate heat. By providing the coolant passage (8) between the switching element unit (3) and the capacitor unit (4), both units can be cooled by a single cooling member. Therefore, the inverter unit (1) having a cooling function can be made compact.

In addition, it is preferred that the inverter unit (1) include a control unit (2) that controls driving of the inverter circuit (10), and the capacitor unit (4), the switching element unit (3), and the control unit (2) be stacked on top of each other in this order in the first direction (D1).

According to this configuration, by stacking the plurality of units (4, 3, and 2) on top of each other in the first direction (D1), the inverter unit (1) can be made compact.

REFERENCE SIGNS LIST

1: Inverter unit, 2: Control unit, 3: Switching element unit, 4: Capacitor unit, 5: First busbar, 5N: First negative-polarity busbar, 5P: First positive-polarity busbar, 6: Second busbar, 6N: Second negative-polarity busbar, 6P: Second positive-polarity busbar, 7: Capacitor case, 8: Coolant passage, 10: Inverter circuit, 11: Direct-current power supply, 30: Switching element, 40: Capacitor element, 41: First portion, 41E: Side electrode, 41N: First negative electrode, 41P: First positive electrode, 42: Second portion, 42N: Second negative electrode, 42P: Second positive electrode, 51: First-direction extending portion, 79: Plate-like projecting portion, 79A: Plate-like projecting portion, 79B: Plate-like projecting portion, 80: Rotating electrical machine, D1: First direction, D2: Second direction, D3: Third direction, E1: First electrode plane, E2: Second electrode plane, N: Negative polarity, P: Positive polarity, R1: Reference plane, P: Positive polarity, and R1: Reference plane

The invention claimed is:

1. An inverter unit comprising: a switching element unit forming an inverter circuit that includes a plurality of switching elements and converts electric power between direct current and alternating current; and a capacitor unit that smooths a voltage on a direct-current side of the inverter circuit, wherein the capacitor unit includes a first portion with a first length, the first length being a length in a first direction, the first direction being a direction orthogonal to a reference plane of the inverter unit; and a second portion with a second length shorter than the first length, the second length being a length in the first direction, and the first portion and the second portion are disposed adjacent to each other along the reference plane, and the switching element unit is disposed so as to overlap the second portion as viewed in the first direction, and overlap the first portion as viewed in a second direction, the second direction being a direction in which the first portion and the second portion are arranged along the reference plane.

2. The inverter unit according to claim 1, wherein the capacitor unit includes a plurality of capacitor elements inside the capacitor unit, and a length in the first direction of a corresponding one of the capacitor elements at the first portion is longer than a length in the first direction of a corresponding one of the capacitor elements at the second portion.

3. The inverter unit according to claim 2, wherein the first portion includes a first positive electrode and a first negative electrode such that the first positive electrode and the first negative electrode each have a side electrode along a side in the first direction, the first positive electrode and the first negative electrode being positive and negative electrodes of the capacitor unit, respectively, the switching element unit includes a positive-polarity terminal and a negative-polarity terminal that are connected to a positive polarity and a negative polarity on the direct-current side of the inverter circuit, and a first positive-polarity busbar that electrically connects the first positive electrode to the positive-polarity terminal and a first negative-polarity busbar that electrically connects the first negative electrode to the negative-polarity terminal each include a first-direction extending portion extending in the first direction with the first-direction extending portion being in contact with a corresponding one of the side electrodes.

4. The inverter unit according to claim 3, wherein the two first portions are divisionally disposed at two locations in a third direction orthogonal to the first direction and the second direction, with spacing provided between the two first portions, the positive-polarity terminal and the negative-polarity terminal of the switching element unit are disposed between the two divisionally-disposed first portions, the first positive electrode is formed on one of the two first portions and the first negative electrode is formed on another such that the side electrodes of the two divisionally-disposed first portions face each other as viewed in the third direction, and the first positive-polarity busbar and the first negative-polarity busbar are disposed so as to be along the first positive electrode and the first negative electrode, respectively, and to face each other as viewed in the third direction.

5. The inverter unit according to claim 4, wherein a plane along the reference plane is a first electrode plane, and a plane separated by the second length from the first electrode plane and parallel to the first electrode plane is a second electrode plane, the second portion includes, as positive and negative electrodes of the capacitor unit, a second positive electrode formed along either one of the first electrode plane and the second electrode plane and on one side in the first direction, and a second negative electrode formed along either one of the first electrode plane and the second electrode plane and on the other side, the inverter unit comprises: a second positive-polarity busbar placed along either one of the first electrode plane and the second electrode plane and electrically connected to the second positive electrode; and a second negative-polarity busbar placed along the other one of the first electrode plane and the second electrode plane and electrically connected to the second negative electrode, and the first positive-polarity busbar is continuously formed with the second positive-polarity busbar, and the first negative-polarity busbar is continuously formed with the second negative-polarity busbar.

6. The inverter unit according to claim 5, comprising a capacitor case that accommodates the capacitor unit, wherein the capacitor case includes plate-like projecting portions placed along the first-direction extending portions of the respective first positive-polarity busbar and first negative-polarity busbar.

7. The inverter unit according to claim 6, comprising a capacitor case that accommodates the capacitor unit, wherein the capacitor case includes a coolant passage through which a coolant circulates, between the switching element unit and the second portion in the first direction.

8. The inverter unit according to claim 7, comprising a control unit that controls driving of the inverter circuit, wherein the capacitor unit, the switching element unit, and the control unit are stacked on top of each other in this order in the first direction.

9. The inverter unit according to claim 1, wherein the first portion includes a first positive electrode and a first negative electrode such that the first positive electrode and the first negative electrode each have a side electrode along a side in the first direction, the first positive electrode and the first negative electrode being positive and negative electrodes of the capacitor unit, respectively, the switching element unit includes a positive-polarity terminal and a negative-polarity terminal that are connected to a positive polarity and a negative polarity on the direct-current side of the inverter circuit, and a first positive-polarity busbar that electrically connects the first positive electrode to the positive-polarity terminal and a first negative-polarity busbar that electrically connects the first negative electrode to the negative-polarity terminal each include a first-direction extending portion extending in the first direction with the first-direction extending portion being in contact with a corresponding one of the side electrodes.

10. The inverter unit according to claim 1, comprising a capacitor case that accommodates the capacitor unit, wherein the capacitor case includes a coolant passage through which a coolant circulates, between the switching element unit and the second portion in the first direction.

11. The inverter unit according to claim 1, comprising a control unit that controls driving of the inverter circuit, wherein the capacitor unit, the switching element unit, and the control unit are stacked on top of each other in this order in the first direction.

12. The inverter unit according to claim 2, comprising a capacitor case that accommodates the capacitor unit, wherein the capacitor case includes a coolant passage through which a coolant circulates, between the switching element unit and the second portion in the first direction.

13. The inverter unit according to claim 2, comprising a control unit that controls driving of the inverter circuit, wherein the capacitor unit, the switching element unit, and the control unit are stacked on top of each other in this order in the first direction.

14. The inverter unit according to claim 9, wherein the two first portions are divisionally disposed at two locations in a third direction orthogonal to the first direction and the second direction, with spacing provided between the two first portions, the positive-polarity terminal and the negative-polarity terminal of the switching element unit are disposed between the two divisionally-disposed first portions, the first positive electrode is formed on one of the two first portions and the first negative electrode is formed on another such that the side electrodes of the two divisionally-disposed first portions face each other as viewed in the third direction, and the first positive-polarity busbar and the first negative-polarity busbar are disposed so as to be along the first positive electrode and the first negative electrode, respectively, and to face each other as viewed in the third direction.

15. The inverter unit according to claim 9, wherein a plane along the reference plane is a first electrode plane, and a plane separated by the second length from the first electrode plane and parallel to the first electrode plane is a second electrode plane, the second portion includes, as positive and negative electrodes of the capacitor unit, a second positive electrode formed along either one of the first electrode plane and the second electrode plane and on one side in the first direction, and a second negative electrode formed along either one of the first electrode plane and the second electrode plane and on the other side, the inverter unit comprises: a second positive-polarity busbar placed along either one of the first electrode plane and the second electrode plane and electrically connected to the second positive electrode; and a second negative-polarity busbar placed along the other one of the first electrode plane and the second electrode plane and electrically connected to the second negative electrode, and the first positive-polarity busbar is continuously formed with the second positive-polarity busbar, and the first negative-polarity busbar is continuously formed with the second negative-polarity busbar.

16. The inverter unit according to claim 9, comprising a capacitor case that accommodates the capacitor unit, wherein the capacitor case includes plate-like projecting portions placed along the first-direction extending portions of the respective first positive-polarity busbar and first negative-polarity busbar.

17. The inverter unit according to claim 9, comprising a capacitor case that accommodates the capacitor unit, wherein the capacitor case includes a coolant passage through which a coolant circulates, between the switching element unit and the second portion in the first direction.

18. The inverter unit according to claim 9, comprising a control unit that controls driving of the inverter circuit, wherein the capacitor unit, the switching element unit, and the control unit are stacked on top of each other in this order in the first direction.

19. The inverter unit according to claim 14, wherein
a plane along the reference plane is a first electrode plane, and a plane separated by the second length from the first electrode plane and parallel to the first electrode plane is a second electrode plane,
the second portion includes, as positive and negative electrodes of the capacitor unit, a second positive electrode formed along either one of the first electrode plane and the second electrode plane and on one side in the first direction, and a second negative electrode formed along either one of the first electrode plane and the second electrode plane and on the other side,
the inverter unit comprises: a second positive-polarity busbar placed along either one of the first electrode plane and the second electrode plane and electrically connected to the second positive electrode; and a second negative-polarity busbar placed along the other one of the first electrode plane and the second electrode plane and electrically connected to the second negative electrode, and
the first positive-polarity busbar is continuously formed with the second positive-polarity busbar, and the first negative-polarity busbar is continuously formed with the second negative-polarity busbar.

20. The inverter unit according to claim 14, comprising a capacitor case that accommodates the capacitor unit,
wherein
the capacitor case includes plate-like projecting portions placed along the first-direction extending portions of the respective first positive-polarity busbar and first negative-polarity busbar.

* * * * *